(12) United States Patent
Cho

(10) Patent No.: US 7,348,240 B2
(45) Date of Patent: Mar. 25, 2008

(54) METHOD FOR FORMING METAL LINE IN FLASH MEMORY DEVICE

(75) Inventor: Jung-Il Cho, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 84 days.

(21) Appl. No.: 11/478,270

(22) Filed: Jun. 28, 2006

(65) Prior Publication Data
US 2007/0072372 A1    Mar. 29, 2007

(30) Foreign Application Priority Data
Sep. 29, 2005    (KR) .................. 10-2005-0091676

(51) Int. Cl.
*H01L 21/336* (2006.01)
(52) U.S. Cl. .................. 438/257; 438/216; 438/591
(58) Field of Classification Search ............. 438/257, 438/216, 591
See application file for complete search history.

(56) References Cited
U.S. PATENT DOCUMENTS
6,911,397 B2 *   6/2005   Jun et al. ............... 438/700
7,183,184 B2 *   2/2007   Doczy et al. ............ 438/585

FOREIGN PATENT DOCUMENTS

| JP | 9-270463 | 10/1997 |
|---|---|---|
| KR | 2002-0055153 | 7/2002 |
| KR | 10-2004-0102310 | 12/2004 |
| KR | 10-2005-0002024 | 1/2005 |

* cited by examiner

*Primary Examiner*—Andy Huynh
(74) *Attorney, Agent, or Firm*—Blakely, Sokoloff, Taylor & Zafman

(57) ABSTRACT

A method for forming a metal line in a flash memory device includes sequentially forming a first inter-layer insulation layer, an etch stop layer, a second inter-layer insulation layer, and a hard mask layer over a substrate where a contact plug is formed, etching the hard mask layer to form a hard mask pattern, performing a first etching process on the second inter-layer insulation layer to form a trench exposing a portion of the etch stop layer, performing a second etching process to selectively remove the hard mask pattern and the exposed portion of the etch stop layer, forming a spacer over sidewalls of the trench, and forming a metal line filling the trench to make contact with the contact plug. The hard mask layer and the etch stop layer include substantially the same material. The spacer includes substantially the same material as the first and second inter-layer insulation layers.

12 Claims, 10 Drawing Sheets

METHOD FOR FORMING METAL LINE IN FLASH MEMORY DEVICE

FIELD OF THE INVENTION

The present invention relates to a method for fabricating a semiconductor device; and more particularly, to a method for forming a metal line in a semiconductor memory device.

DESCRIPTION OF RELATED ARTS

Generally in semiconductor memory devices, metal lines are used to transfer a driving voltage applied from outside to a bottom portion of a semiconductor structure. Contact plugs are necessary to make electric contacts between the metal lines and certain semiconductor structures.

In NAND flash memory devices, a source contact plug SRCT and a drain contact plug DRCT are examples of the contact plugs. The SRCT makes contact between a source region and a metal line. The DRCT makes contact between a drain region and a metal line. Particularly, in 70 nm level NAND flash memory devices, a single damascene process or a dual damascene process are employed to form metal lines. In such a damascene process, an etching process to form trenches or via holes uses a hard mask scheme to achieve minimization of metal line patterns and overcome limitations associated with the thickness of photoresist.

FIGS. 1A to 1F illustrate cross-sectional views of metal lines of flash memory devices sequentially fabricated by a typical method. Particularly, for the simplicity of description, FIGS. 1A to 1F illustrate related processes after DRCTs are formed.

Referring to FIG. 1A, a first inter-layer insulation layer 11, an etch stop layer 12, a second inter-layer insulation layer 13, and a hard mask layer 14 are sequentially formed on a substrate 10 where the DRCTs are already formed using the known processes. The first inter-layer insulation layer 11 and the second inter-layer insulation layer 13 are formed of an oxide material. The etch stop layer 12 is formed of a nitride material. The hard mask layer 14 is formed of tungsten (W).

Referring to FIG. 1B, a photoresist pattern 15 is formed using a mask process, and the hard mask layer 14 is etched using the photoresist pattern 15 as an etch mask to form a hard mask pattern 14A. Reference numeral 16 denotes this etching process.

Referring to FIG. 1C, a stripping process is performed to remove the photoresist pattern 15, and the second inter-layer insulation layer 13 is etched using the hard mask pattern 14A as an etch mask to form a plurality of trenches or via holes 18 (hereinafter, referred to as "trenches") inside the second inter-layer insulation layer 13. Reference numerals 17 and 13A denote this etching process and a patterned second inter-layer insulation layer, respectively.

The latter etching process 17 is performed using a high etch selectivity between the oxide material and the nitride material. Due to this high etch selectivity, the second inter-layer 13 can be etched selectively without damaging the etch stop layer 12.

Referring to FIG. 1D, a barrier layer 19 is formed on the above resulting structure. The barrier layer 19 is formed of a nitride-based material and serves a role in reducing damage to the oxide-based second inter-layer insulation layer 13 during a cleaning process performed prior to a metal line process, so that a distance between the metal lines can be maintained.

Referring to FIG. 1E, another etching process 20 is performed to etch the barrier layer 19 and the etch stop layer 12 to make contact with the DRCTs. After the other etching process 20, trenches 21 deeper than the aforementioned trenches 18 are formed inside the first inter-layer insulation layer 11. Particularly, the deeper trenches 21 are formed to have a sloped profile with a certain angle (θ). Reference numerals 19A and 12A denote a patterned barrier layer and a patterned etch stop layer, respectively. Reference numeral 11A denotes a patterned first inter-layer insulation layer 11 after the other etching process 20 to form the deeper trenches 21.

Referring to FIG. 1F, a tungsten layer is formed to fill the deeper trenches 21, and a chemical mechanical polishing (CMP) process is performed to planarize the tungsten layer to thereby form isolated metal lines 22 filled into the deeper trenches 21. Although not illustrated, the metal lines 22 make electric contacts with the DRCTs.

Typically, the other etching process 20 to etch the etch stop layer 12 proceeds with an over etching process to provide stable contacts with the DRCTs. However, since the etch stop layer 12 does not have a uniform thickness, the deeper trenches 21 do not have a consistent slope. Specifically, when the second inter-layer insulation layer 13 is etched as illustrated in FIG. 1C, the etch stop layer 12 is also recessed. A degree of the recess is not uniform for each wafer or lot, and thus, the etch stop layer 12 remains with the inconsistent thickness.

Hence, during the other etching process 20 (see FIG. 1E), the etch stop layer 12 remaining with the inconsistent thickness for each lot causes the deeper trenches 21 inside the first inter-layer insulation layer 11 to have a different slope. The metal lines 22 serving as bit lines as illustrated in FIG. 1F and FIG. 2 fill the deeper trenches 21. Even if the metal lines 22 are formed to have a uniform thickness, the slopes of the deeper trenches 21 are generally not consistent for each lot. As a result, as illustrated in FIG. 3, sheet resistance Rs of the bit lines may vary for each wafer or lot.

SUMMARY OF THE INVENTION

It is, therefore, an object of the present invention to provide a method for forming a metal line in a flash memory device capable of improving an electric characteristic by allowing sheet resistance of a bit line coupled with a drain contact plug to be consistent for each wafer or lot.

In accordance with an aspect of the present invention, there is provided a method for forming a metal line in a flash memory device, the method including: sequentially forming a first inter-layer insulation layer, an etch stop layer, a second inter-layer insulation layer, and a hard mask layer over a substrate where a contact plug is already formed, the hard mask layer and the etch stop layer including substantially the same material; etching the hard mask layer to form a hard mask pattern; performing a first etching process on the second inter-layer insulation layer using the hard mask pattern as a mask to form a trench exposing a portion of the etch stop layer; performing a second etching process to selectively remove the hard mask pattern and the exposed portion of the etch stop layer; forming a spacer over sidewalls of the trench, the spacer including substantially the same material as the first and second inter-layer insulation layers; and forming a metal line filling the trench to make contact with the contact plug.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A method for forming a metal line in a flash memory device in accordance with exemplary embodiments of the present invention will be described in detail with reference to the accompanying drawings.

FIGS. 4A to 4G are cross-sectional views illustrating a method for forming a metal line in a flash memory device in accordance with an embodiment of the present invention. The term "on" or "upper portion" used hereinafter may be "on" or "upper portion" of a corresponding layer, or "on" or "upper portion" of a corresponding layer where a certain layer is interposed.

Figure 1A:
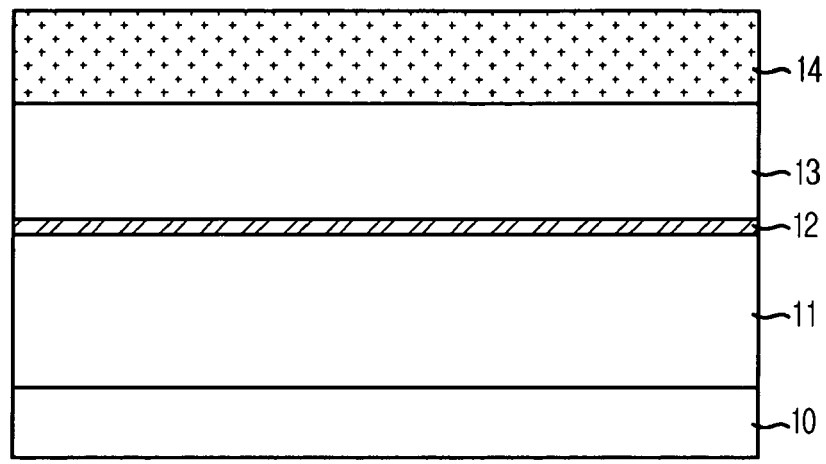
FIGS. 1A to 1F are cross-sectional views illustrating a typical method for forming a metal line in a flash memory.
Figure 1B:
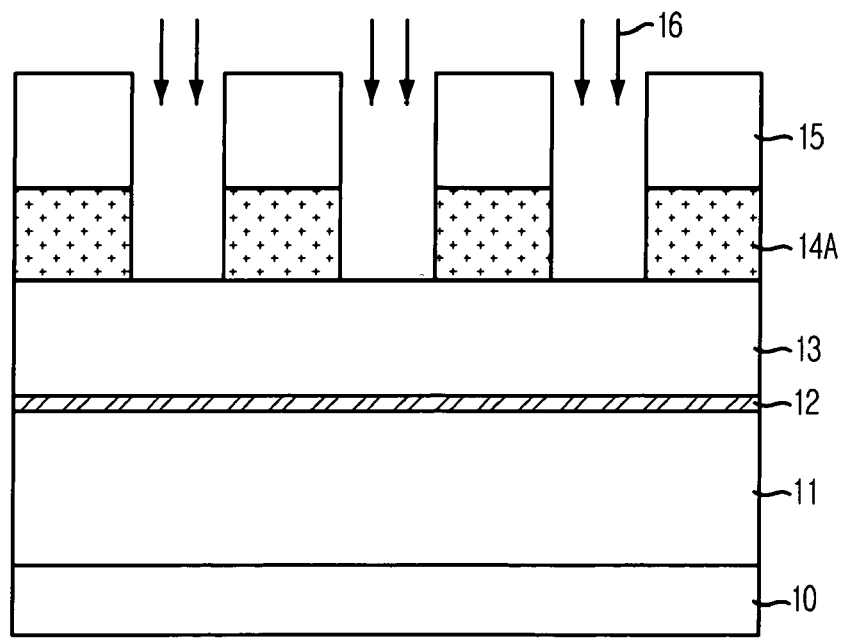
Figure 1C:
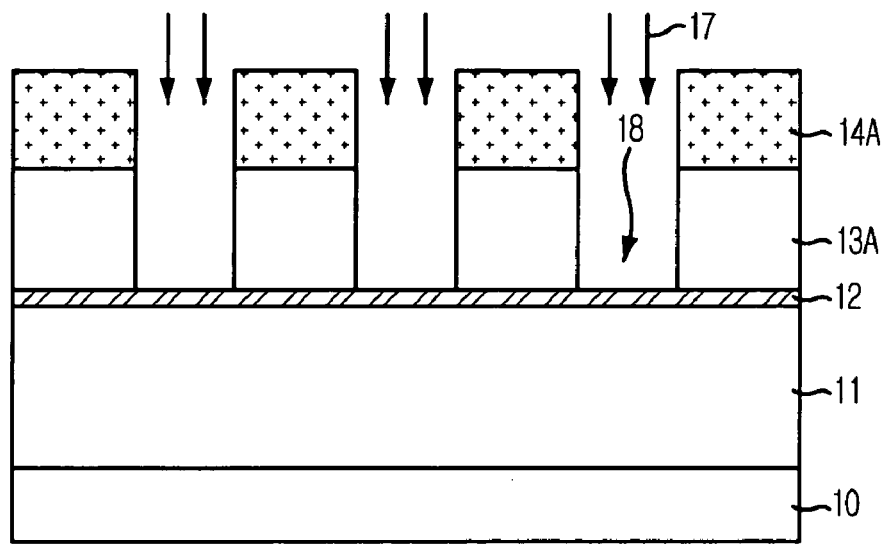
Figure 1D:
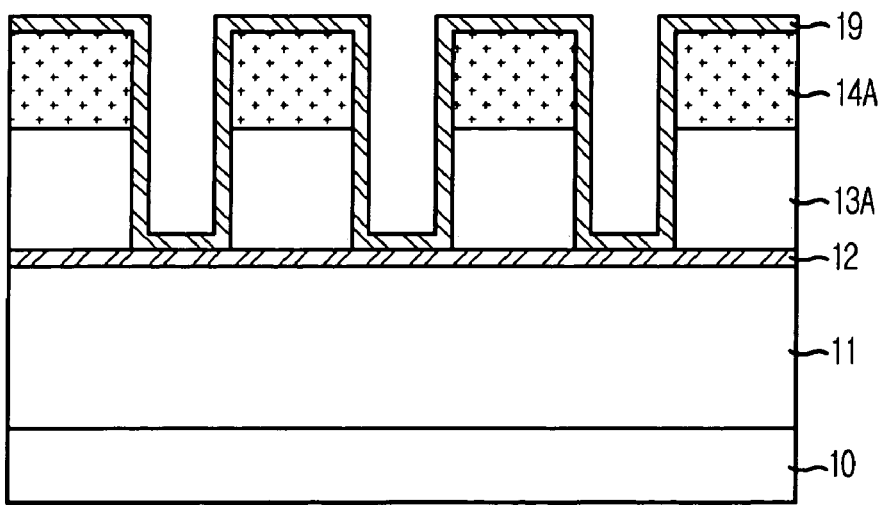
Figure 1E:
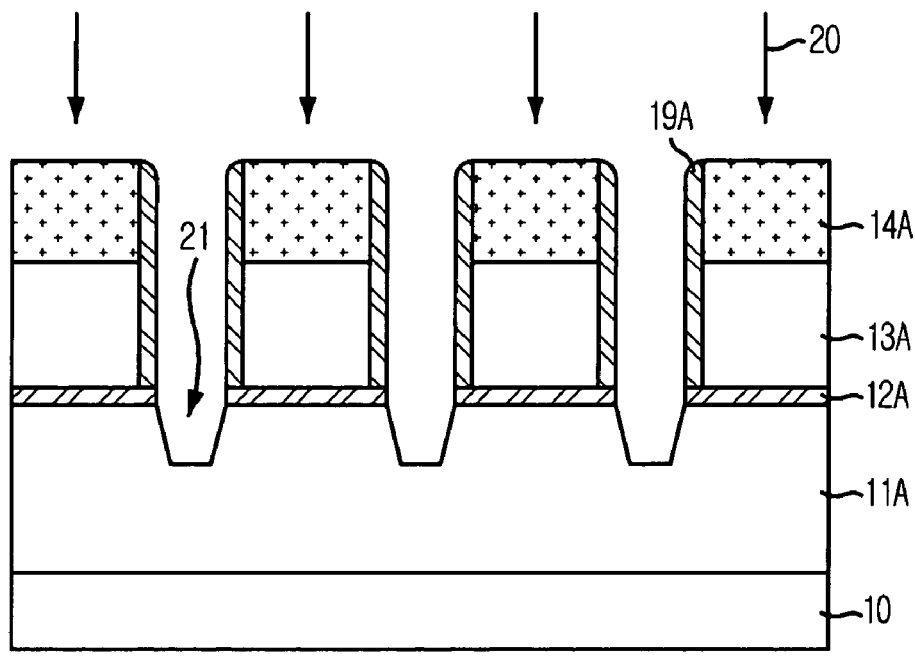
Figure 1F:
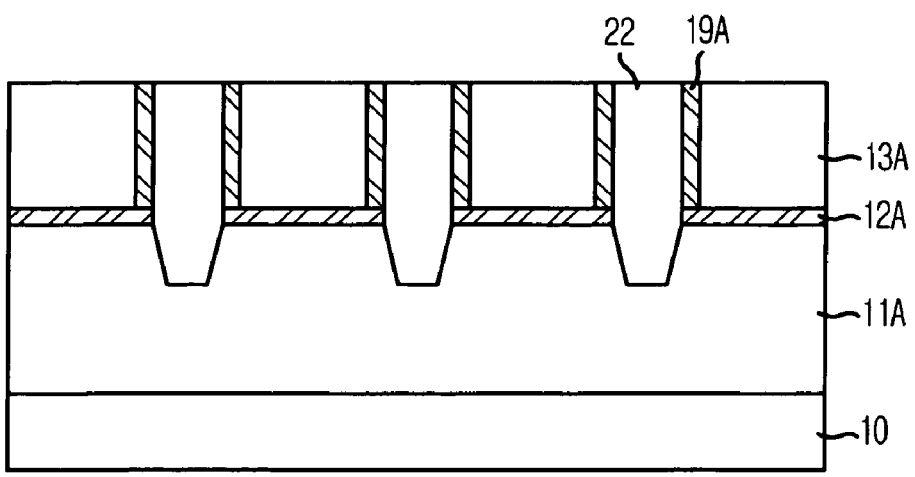
Figure 2:
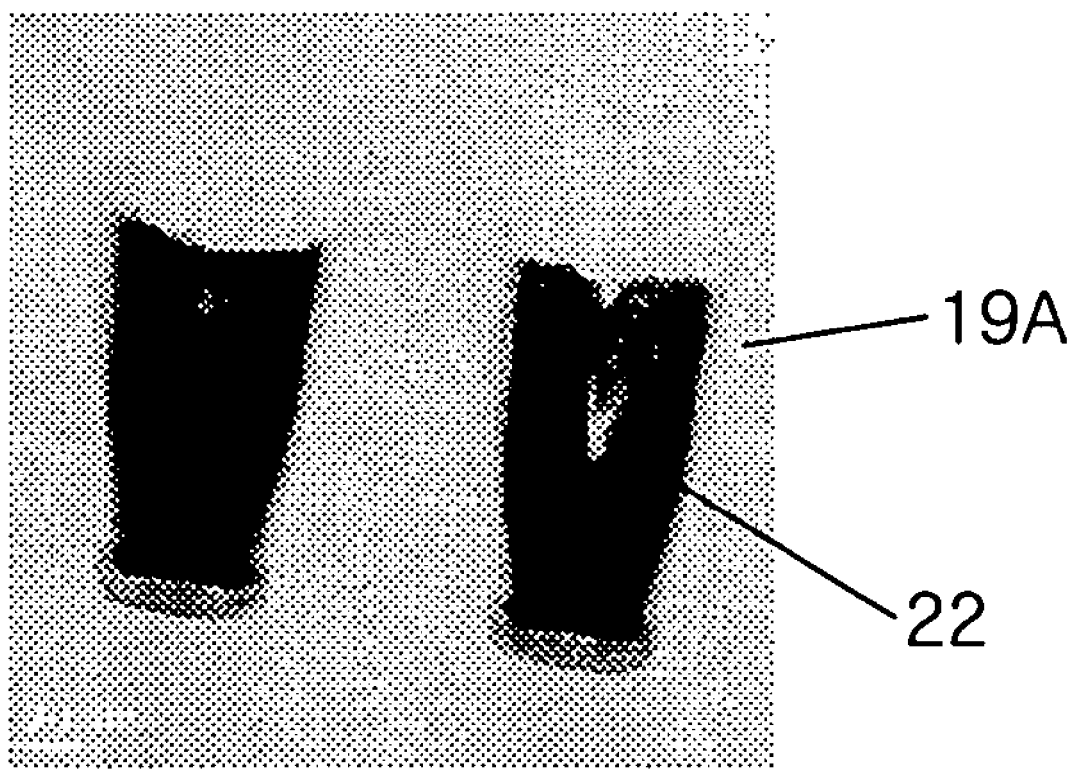
FIG. 2 illustrates a micrographic scanning electron microscopy (SEM) image of a cross-sectioned metal line structure illustrated in FIG. 1F.
Figure 3:
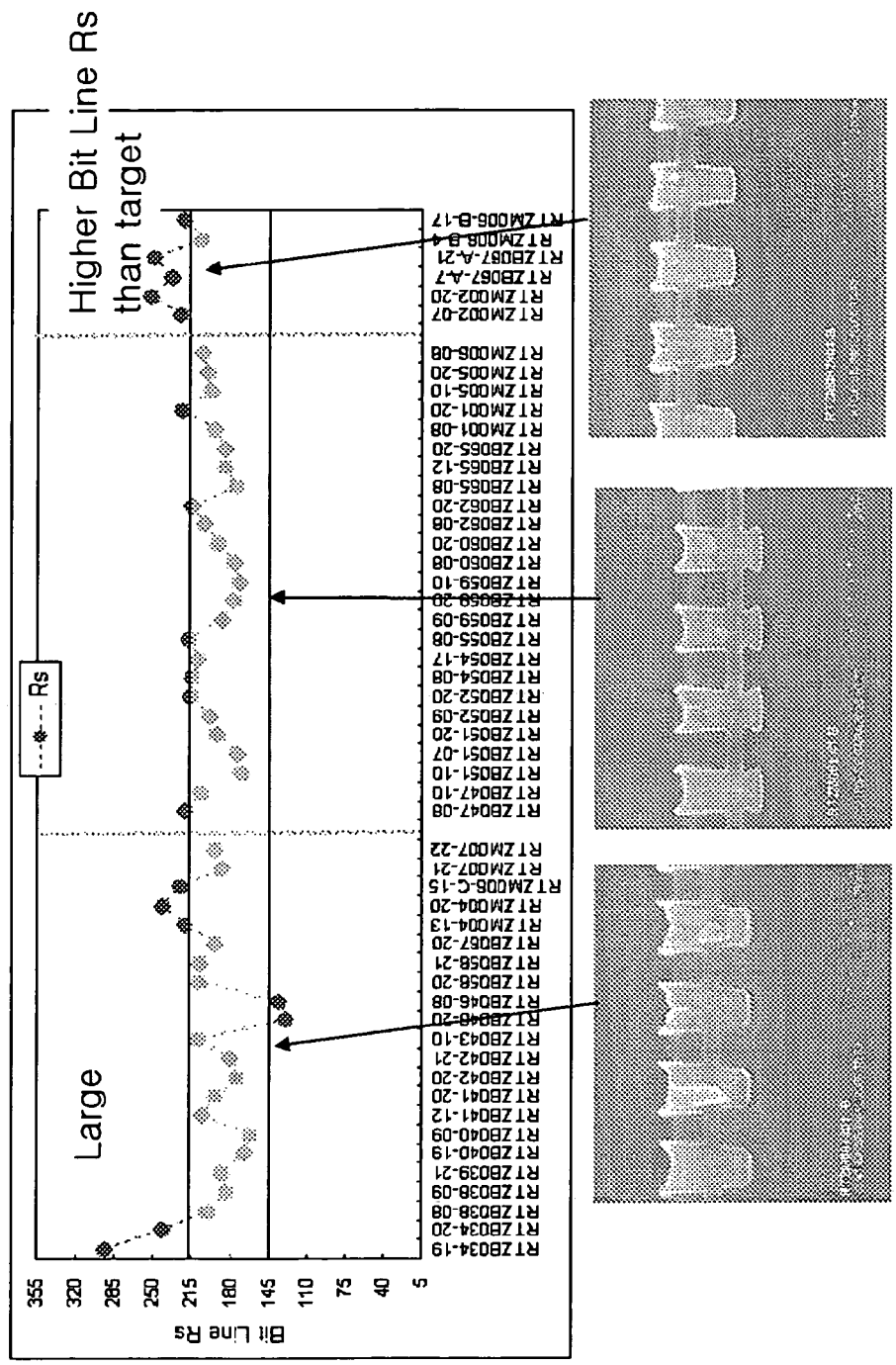
FIG. 3 illustrates a graph of a change in sheet resistance of a bit line for each lot.
Figure 4A:
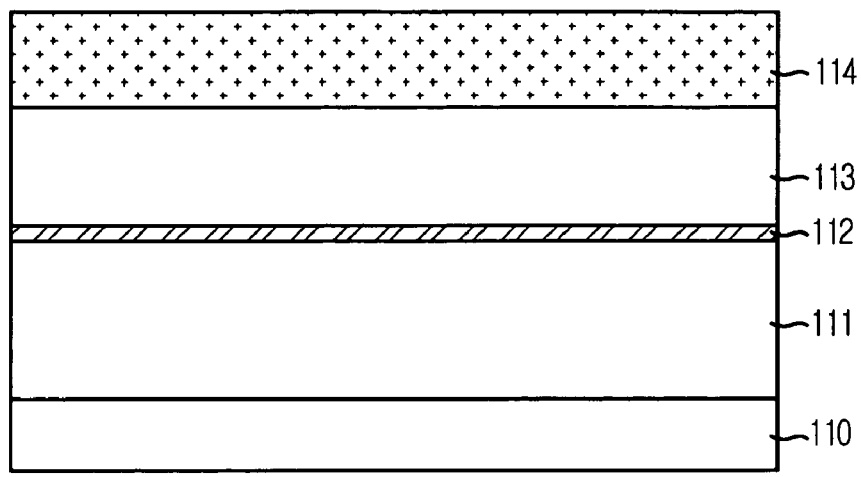
FIGS. 4A to 4G are cross-sectional views illustrating a method for forming a metal line in a flash memory device in accordance with an embodiment of the present invention.

Referring to FIG. 4A, a first inter-layer insulation layer 111, an etch stop layer 112, a second inter-layer insulation layer 113, and a hard mask layer 114 are sequentially formed on a substrate 110 where DRCTs are already formed using the known processes. The first inter-layer insulation layer 111 and the second inter-layer insulation layer 113 include an oxide-based material, and the etch stop layer 112 and the hard mask layer 114 include a nitride-based material. For instance, the first inter-layer insulation layer 111 includes one oxide-based material selected from a group consisting of carbon doped oxide, a carbon containing low dielectric material, high density plasma (HDP) oxide, borophosphosilicate glass (BPSG), phosphosilicate glass (PSG), plasma enhanced tetraethyl orthosilicate (PETEOS), undoped silicate glass (USG), fluorinated silicate glass (FSG), and organo-silicate glass (OSG). The carbon containing low dielectric material may have a dielectric constant less than approximately 3, and SiOC is an example of the carbon containing low dielectric material. Also, the first-inter layer insulation layer 111 can be formed in a single layer or in multiple layers using the selected oxide-based material.

The etch stop layer 112 includes a nitride-based material or oxynitride-based material, both having a high etch selectivity to an oxide material. For instance, the etch stop layer 112 may include one selected from the group consisting of tantalum nitride (TaN), tantalum aluminum nitride (TaAlN), tantalum silicon nitride (TaSiN), titanium nitride (TiN), titanium silicon nitride (TiSiN), tungsten nitride (WN), tungsten boron nitride (WBN), and silicon oxynitride (SiON). The etch stop layer 112 is formed to have a thickness ranging from approximately 200 Å to approximately 400 Å using one of a physical vapor deposition (PVD) method, a chemical vapor deposition (CVD) method, and an atomic layer deposition (ALD) method. Particularly, the etch stop layer 112 is formed to a thickness of approximately 300 Å.

The second inter-layer insulation layer 113 is formed to a thickness ranging from approximately 1,500 Å to approximately 2,000 Å using one of a CVD method and a PVD method. Particularly, the second inter-layer insulation layer 113 has a thickness of approximately 1,800 Å. The second inter-layer insulation layer 113 includes substantially the same material as the first inter-layer insulation layer 111. The hard mask layer 114 includes a nitride-based material such as silicon nitride (SiN) and, is formed to a thickness ranging from approximately 300 Å to approximately 500 Å using a low pressure chemical vapor deposition (LPCVD) method. Particularly, the hard mask layer 114 may have a thickness of approximately 400 Å. After the first inter-layer insulation layer 111 and the second inter-layer insulation layer 113 are formed, a CMP process can be performed for planarization.

Figure 4B:
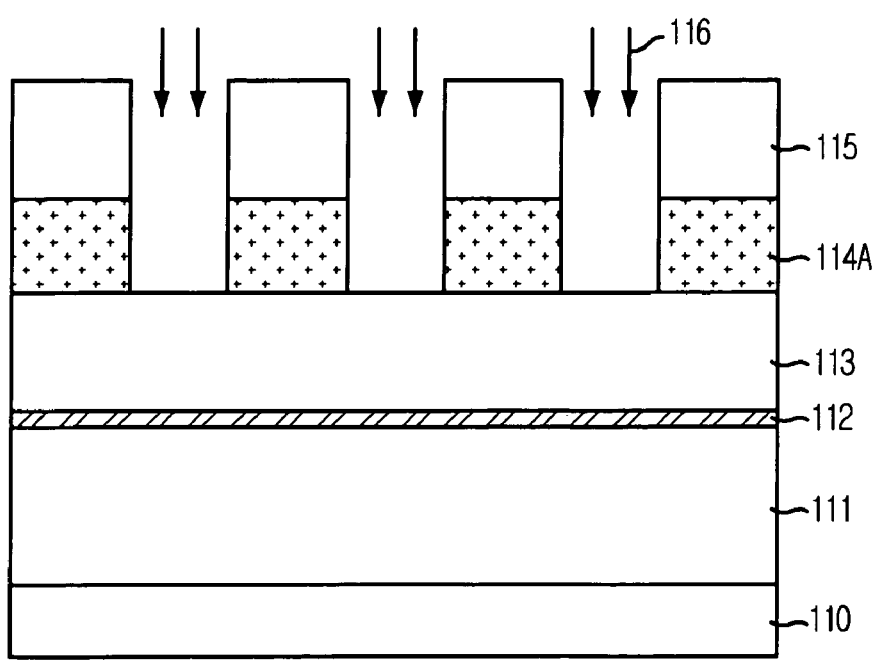

Referring to FIG. 4B, a photoresist layer is coated on the hard mask layer 114 and subjected to a photolithography process to form a photoresist pattern 115. A first etching process 116 is performed using the photoresist pattern 115 as an etch mask to etch the hard mask layer 114. The hard mask layer 114 is etched such that certain portions of the second inter-layer insulation layer 113 are exposed. Reference numeral 114A represents a hard mask pattern after the first etching process 116.

Figure 4C:
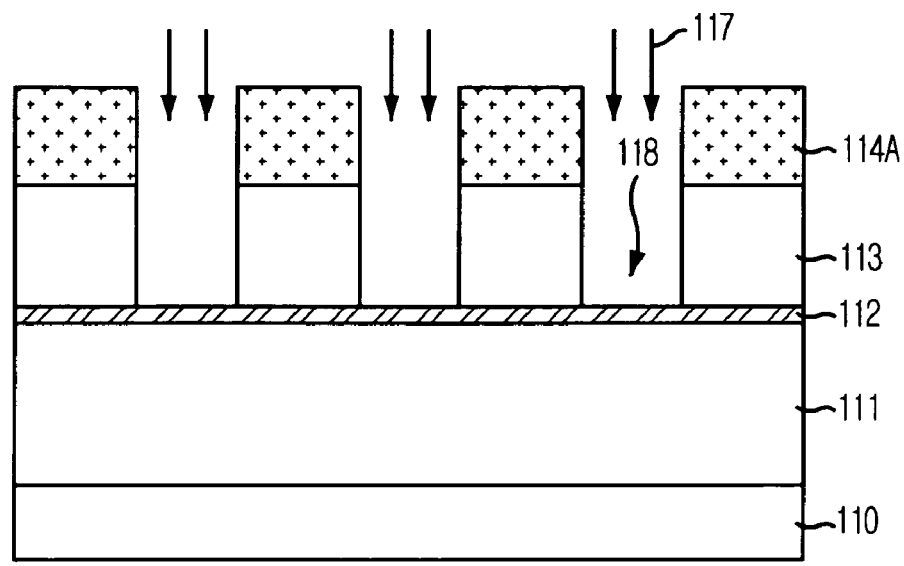

Referring to FIG. 4C, a stripping process is performed to remove the photoresist pattern 115. The resulting structure after the stripping process is cleaned using diluted hydrogen fluoride (HF) or buffered oxide etchant (BOE) to remove polymers, particles, and native oxide layers usually generated during the etching process.

A second etching process 117 is performed using the hard mask pattern 114a as an etch mask to etch the second inter-layer insulation layer 113. As a result, first trenches 118 exposing certain portions of the etch stop layer 112 are formed. Particularly, the second etching process 117 utilizes a high etch selectivity between an oxide material and a nitride material when selectively etching the second inter-layer insulation layer 113. Reference numeral 113A denotes a patterned second inter-layer insulation layer after the second etching process 117.

Figure 4D:
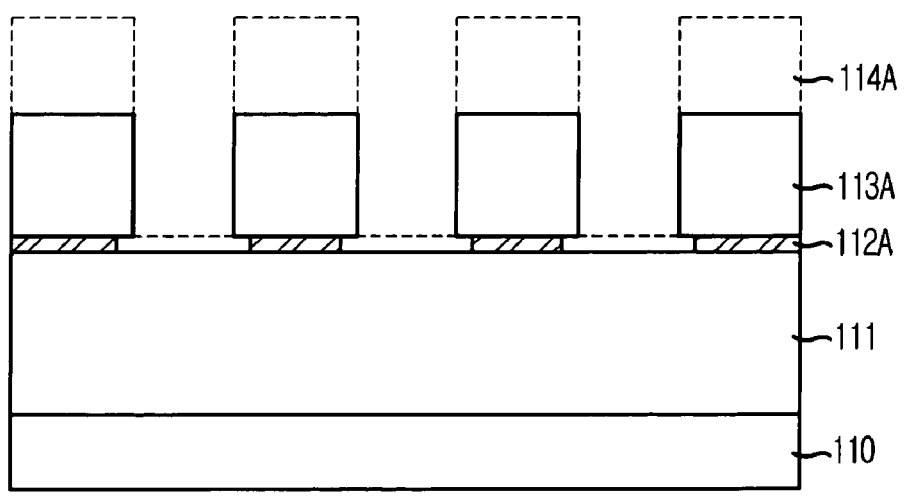

Referring to FIG. 4D, a wet etching process is performed using phosphoric acid ($H_3PO_4$) to remove the nitride-based hard mask pattern 114A and simultaneously the portions of the nitride-based etch stop layer 112 exposed by the first trenches 118. Since the etch stop layer 112 is etched away selectively through the wet etching process, the first inter-layer insulation layer 111 is less likely to be etched. Even if the first inter-layer insulation layer 111 is etched, the etch thickness is negligible and uniform. Reference numeral 112A is a patterned etch stop layer after the wet etching process.

Figure 4E:
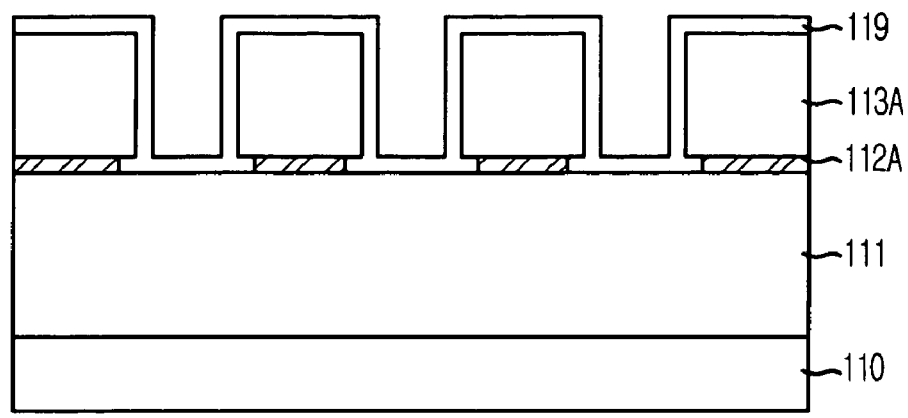

Referring to FIG. 4E, a spacer layer 119 is formed on the above resulting structure. The spacer layer 119 includes an oxide-based material, and serves a role in reducing damage to the second inter-layer insulation layer 113 during a cleaning process performed prior to a metal line process and maintaining a distance between the metal lines. The spacer layer 119 is formed to a thickness ranging from approximately 100 Å to approximately 300 Å, and more particularly to a thickness of approximately 200 Å.

In the present embodiment, the spacer layer 119 includes an oxide-based material instead of a nitride-based material to reduce the formation of undesired sloped trenches. In more detail, if the spacer layer 119 includes a nitride-based material, the first inter-layer insulation layer 111 is more likely to be over etched to have sloped trenches due to a specific etch selectivity. On the contrary, if the spacer layer 119 includes an oxide-based material substantially identical to the first inter-layer insulation layer, the over-etching does not produce sloped trenches due to the same material characteristic of the spacer layer 119 and the first inter-layer insulation layer 111. Particularly, the trenches obtained after the over etching have a vertical profile.

Figure 4F:
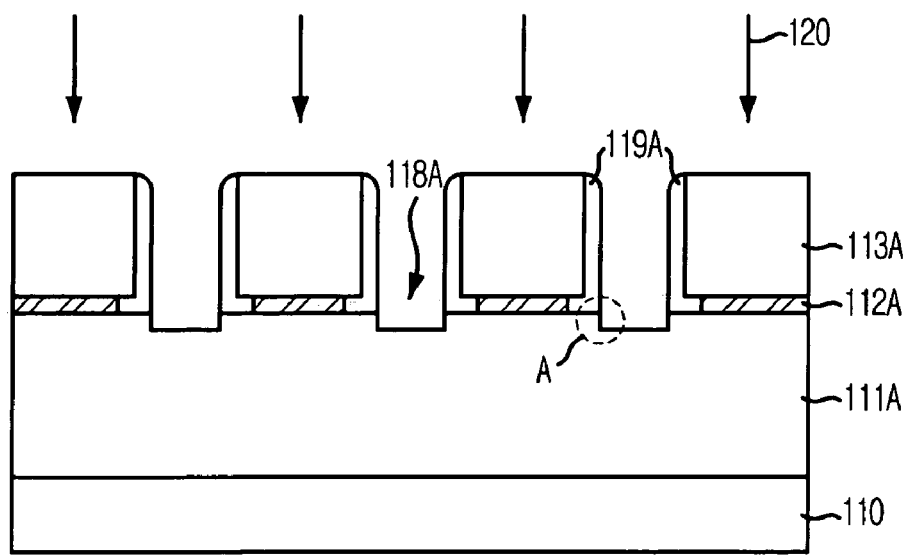

Referring to FIG. 4F, an etch-back process or a blanket etching process 120 is performed to form spacers 119A by etching portions of the spacer layer 119 disposed on the patterned second inter-layer insulation layer 113A. At this point, the first inter-layer insulation layer 111 is also recessed to a certain depth; however, the resultant etch profile is substantially vertical since the etch target layers (i.e., the spacer layer 119 and the first inter-layer insulation layer 111) of the etch-back or blanket etching process 120 include substantially the same oxide-based material. Reference numeral 118A denotes second trenches that become deeper than the first trenches 118 after the etch-back or blanket etching process.

Figure 4G:
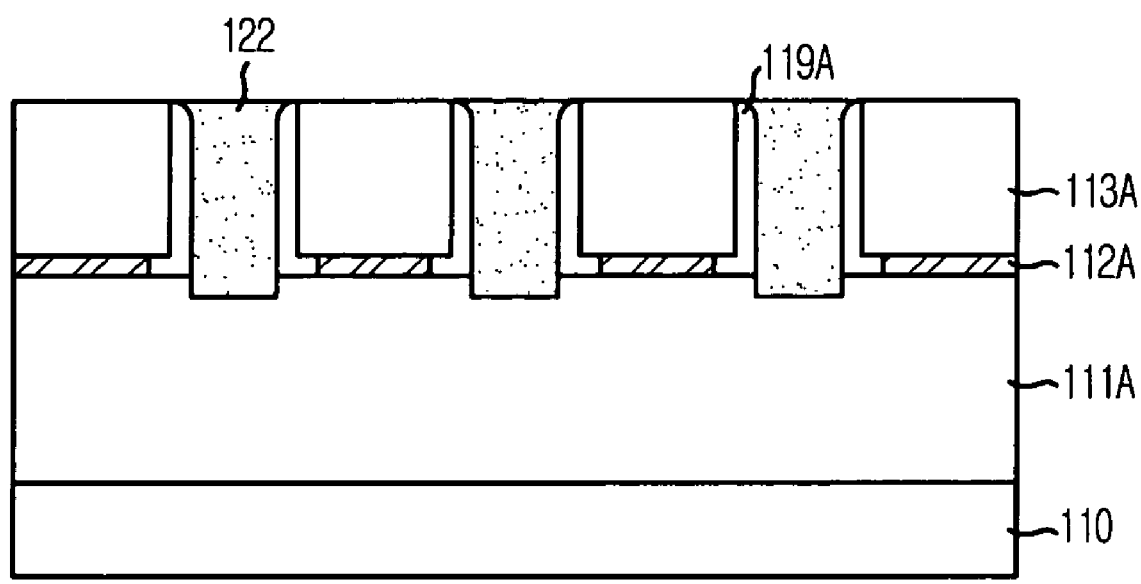

Referring to FIG. 4G, a metal-based material fills the second trenches 118A and is planarized using a planarization process such as CMP to form isolated metal lines 122 inside the second trenches 118A. The metal-based material includes a conductive material selected from a group consisting of aluminum (Al), W, copper (Cu), platinum (Pt), titanium (Ti), tantalum (Ta), and cobalt (Co).

Figure 5:
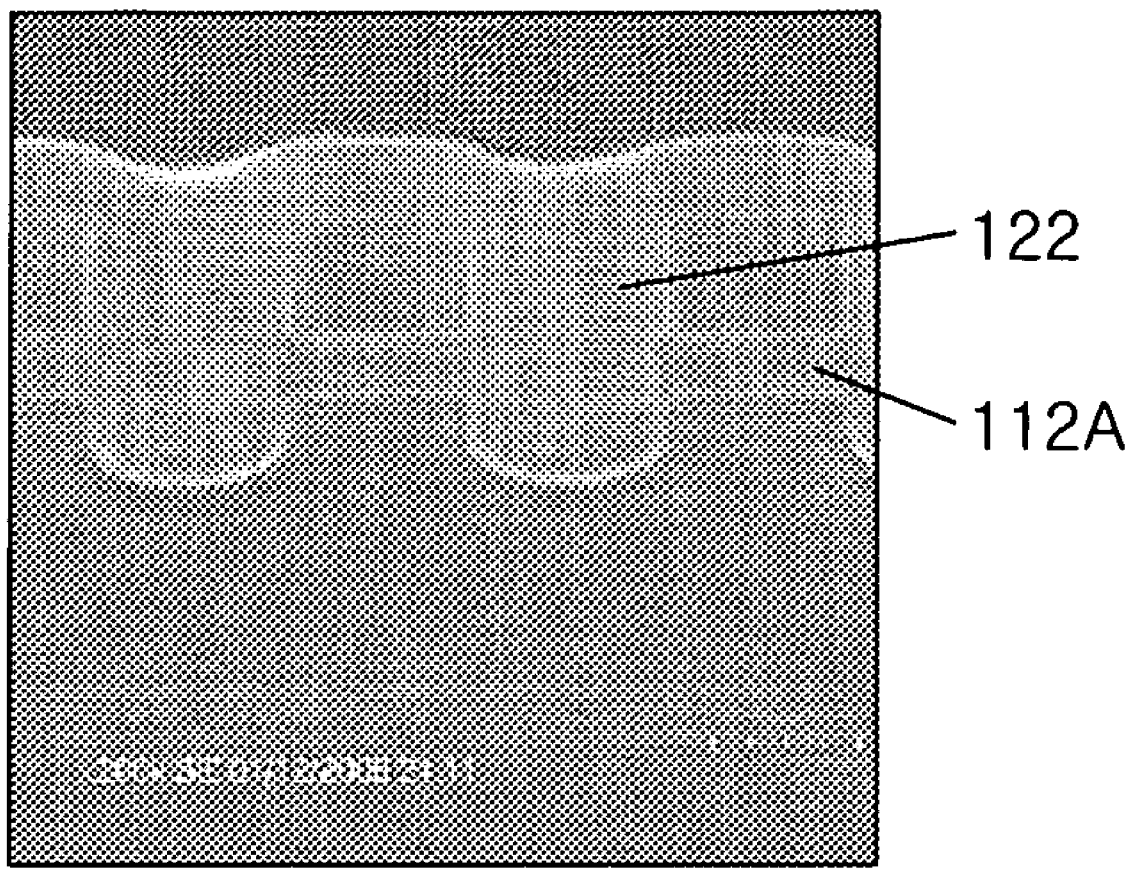
FIG. 5 illustrates a micrographic SEM image of a cross-sectioned metal line structure illustrated in FIG. 4G.

As reference letter 'A' illustrates, the bottom portions of the second trenches 118A have a vertical profile. Thus, the metal lines 122 are formed uniformly for each wafer or lot as illustrated in FIGS. 4G and 5. This uniformity allows bit lines (i.e., the metal lines 122) to have a consistent level of sheet resistance (Rs).

According to the exemplary embodiment of the present invention, the metal lines for use as bit lines contacting the DRCTs are formed uniformly for each wafer or lot. As a result, the sheet resistance of the bit lines can be maintained consistent, thereby improving an electric characteristic.

The present application contains subject matter related to the Korean patent application No. KR 2005-0091676, filed in the Korean Patent Office on Sep. 29, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a metal line in a flash memory device, the method comprising:

sequentially forming a first inter-layer insulation layer, an etch stop layer, a second inter-layer insulation layer, and a hard mask layer over a substrate where a contact plug is already formed;

etching the hard mask layer to form a hard mask pattern;

performing a first etching process on the second inter-layer insulation layer using the hard mask pattern as a mask to form a trench exposing a portion of the etch stop layer;

performing a second etching process to selectively remove the hard mask pattern and the exposed portion of the etch stop layer;

forming a spacer over sidewalls of the trench, the spacer including substantially the same material as the first inter-layer insulation layer; and forming a metal line filling the trench to make contact with the contact plug.

2. The method of claim 1, wherein the hard mask layer includes a nitride-based material.

3. The method of claim 1, wherein the hard mask layer is formed to a thickness of approximately 300 Å to approximately 500 Å.

4. The method of claim 1, wherein the second etching process comprises a wet etching process using phosphoric acid ($H_3PO_4$).

5. The method of claim 1, wherein the forming of the spacer comprises performing one of an etch-back process and a blanket etching process.

6. The method of claim 1, wherein the spacer includes an oxide-based material.

7. The method of claim 1, wherein the spacer is formed to a thickness ranging from approximately 100 Å to approximately 300 Å.

8. The method of claim 1, wherein the forming of the spacer comprises recessing an upper portion of the first inter-layer insulation layer to a predetermined depth.

9. The method of claim 8, wherein the recessed upper portion has an etch profile being substantially vertical.

10. The method of claim 6, wherein the oxide-based material for the spacer includes one selected from a group consisting of carbon doped oxide, a carbon containing low dielectric material, high density plasma (HDP) oxide, borophosphosilicate glass (BPSG), phosphosilicate glass (PSG), plasma enhanced tetraethyl orthosilicate (PETEOS), undoped silicate glass (USG), fluorinated silicate glass (FSG), and organo-silicate glass (OSG).

11. The method of claim 1, wherein the hard mask layer and the etch stop layer include substantially the same material.

12. The method of claim 1, wherein the spacer includes substantially the same material as the second inter-layer insulation layer.

* * * * *